(12) United States Patent
Roh et al.

(10) Patent No.: US 12,416,668 B2
(45) Date of Patent: Sep. 16, 2025

(54) APPARATUS FOR TESTING SEMICONDUCTOR PACKAGE

(71) Applicant: TSE CO., LTD., Cheonan-si (KR)

(72) Inventors: Dae Hyun Roh, Cheonan-si (KR); Yun Chan Nam, Cheonan-si (KR)

(73) Assignee: TSE CO., LTD., Cheonan-si (KR)

( * ) Notice: Subject to any disclaimer, the term of this patent is extended or adjusted under 35 U.S.C. 154(b) by 101 days.

(21) Appl. No.: 18/290,828

(22) PCT Filed: Aug. 11, 2022

(86) PCT No.: PCT/KR2022/012001
§ 371 (c)(1),
(2) Date: Jan. 22, 2024

(87) PCT Pub. No.: WO2023/027395
PCT Pub. Date: Mar. 2, 2023

(65) Prior Publication Data
US 2024/0337688 A1    Oct. 10, 2024

(30) Foreign Application Priority Data
Aug. 27, 2021 (KR) .................. 10-2021-0114097

(51) Int. Cl.
G01R 31/28 (2006.01)
G01R 1/04 (2006.01)
(Continued)

(52) U.S. Cl.
CPC ....... G01R 31/2896 (2013.01); G01R 1/0408 (2013.01); G01R 31/2886 (2013.01)

(58) Field of Classification Search
CPC . G01R 1/02; G01R 1/04; G01R 1/067; G01R 1/073; G01R 3/00; G01R 31/27; G01R 31/28
See application file for complete search history.

(56) References Cited

U.S. PATENT DOCUMENTS 7,471,096 B2   12/2008   Kohashi et al.
11,231,443 B2   1/2022   Cho et al.

FOREIGN PATENT DOCUMENTS

KR   10-2006-0093670 A   8/2006
KR   10-2011-0090298 A   8/2011
(Continued)

Primary Examiner — Neel D Shah
(74) Attorney, Agent, or Firm — You & IP, LLC

(57) ABSTRACT

The objective of the present disclosure is to provide a semiconductor package test apparatus for testing a semiconductor package by means of connecting a semiconductor package and a test board. The test apparatus according to the present disclosure comprises: a conductive part mounted on a test board providing a test signal, formed at each of positions corresponding to a pad of the test board, and having a plurality of conductive particles aligned in a thickness direction in an elastic insulating material; a test socket made of an elastic insulating material and including an insulating part insulating the conductive part from another adjacent conductive part while supporting the conductive part; a multi-layer organic product closely disposed on the upper side of the test socket and having a lower land formed at each of positions corresponding to the conductive part, an upper land formed at each of positions corresponding to a terminal of the semiconductor package, and a wiring pattern connecting the lower land and the upper land formed in a substrate; and a pitch converter deposited on the upper land and having conductive contact pins contacting the terminals of the semiconductor package, wherein the lower end of the conductive part is connected to the pad of the test board, and the upper end of the conductive part is connected to the lower land, such that the semiconductor package and the test board having different pitches can be tested.

10 Claims, 7 Drawing Sheets

(51) Int. Cl.
*G01R 1/067* (2006.01)
*G01R 1/073* (2006.01)
*G01R 3/00* (2006.01)
*G01R 31/27* (2006.01)

(56) References Cited

FOREIGN PATENT DOCUMENTS

| | | | | |
|---|---|---|---|---|
| KR | 10-1514636 | B1 | 4/2015 | |
| KR | 10-2016-0117049 | A | 10/2016 | |
| KR | 20170009443 | A * | 1/2017 | ........... G01R 1/0416 |
| KR | 10-1785428 | B1 | 10/2017 | |

* cited by examiner (a)

(b)

(c)

APPARATUS FOR TESTING SEMICONDUCTOR PACKAGE

TECHNICAL FIELD

The present disclosure relates to an apparatus for testing a semiconductor package, more particularly, to an apparatus for testing a semiconductor package, which is employed to transmit electrical signals by connecting the semiconductor package and a test board which have different pitches.

BACKGROUND ART

At present, various types of test sockets configured to transmit electrical signals have been employed in various fields such as an electronic industrial field, a semiconductor industrial field, or the like.

As an example, a test socket is used in a process for testing a semiconductor device. Testing the semiconductor device is conducted to determine whether the manufactured semiconductor device is defective. In the test process, predetermined test signals are sent from a test apparatus to the semiconductor device to determine whether the semiconductor device is short-circuited. This test apparatus and the semiconductor device are not directly connected to each other, but indirectly connected to each other via a test socket.

Representative test sockets include a pogo socket and a rubber socket. In the case of the pogo socket, individually manufactured pogo pins are assembled into a housing to form the pogo socket, although short-circuit and leakage between the pogo pins are less likely to occur, the demand for rubber sockets is increasing rather than the pogo sockets in the semiconductor test process due to damage to package balls and rising in unit cost.

The rubber socket has a configuration in which electrically-conductive parts having a plurality of electrically-conductive particles contained within an elastic material such as silicon or the like are disposed to be insulated from each other inside an insulating part made of an elastic material such as silicon or the like. The above rubber socket has the property that it shows the conductivity only in a thickness direction, and does not use mechanical means such as soldering or springs, so it is excellent in durability and has the advantage of being able to achieve simple electrical connection. Additionally, since the above rubber socket can absorb mechanical shock or deformation, it has the advantage of enabling smooth connection to semiconductor device or the like.

FIG. 1 schematically shows a test apparatus 1000 having a test socket made as a conventional rubber socket used in a test process for a semiconductor package.

A test socket 20 shown in FIG. 1 includes a plurality of electrically-conductive parts 21 formed at positions corresponding to terminals 11 of a semiconductor package 10, respectively, and an insulating part 22 supporting the plurality electrically-conductive parts 21 to be spaced apart from each other. The electrically-conductive part 21 is formed to have a configuration in which a plurality of electrically-conductive particles are contained within an elastic insulating material. The conventional test socket 20 is installed on a test board 30 mounted on a tester (not shown), an upper end of the electrically-conductive part 21 comes in contact with the terminal 11 of the semiconductor package 10, and a lower end comes in contact with a pad 31 of the tester board 30, so the test board 30 and the semiconductor package 10 are electrically connected to each other.

In order to prevent damage to the electrically-conductive part 21 caused by repeated contact with the terminal 11 of the semiconductor package 10 and improve electrical contact performance, the above conventional test socket 20 has a configuration in which a metallic electric conductor 23 is placed on the electrically-conductive part 21 and the metallic electric conductor 23 may be supported by a support film 24. However, since the hard metallic electric conductor 23 comes directly in contact with the elastic electrically-conductive part 21, there is a problem that damage to the elastic electrically-conductive part 21 cannot be avoided.

In addition, the conventional test socket 20 has the characteristic that the electrically-conductive part 21 is formed in a pillar shape extending upward/downward, so there is a problem that the above socket can be used only when the pitch of the semiconductor package 10 is the same as the pitch of the test board 30 (b=p), but cannot be used when the pitch of the semiconductor package 10 differs from the pitch of the test board 30 (b p).

Here, the term "pitch" means a distance between terminals of the semiconductor package or between pads of the test board. FIG. 2 illustrates that, in a test apparatus 2000 provided with the test board 30 having a pitch different from a pitch of the semiconductor package 10, the test socket 20 cannot connect the semiconductor package 10 and the test board 30 to each other.

In addition, as the semiconductor package is highly integrated, the size and pitch of the electrically-conductive part of the rubber socket must be adjusted to cope with the fine pitch of the semiconductor package; however, due to the smaller size of the electrically-conductive parts and the narrow pitch of the electrically-conductive parts, there are many problems that must be solved in the use of rubber sockets, such as short circuit between electrically-conductive parts, reduced durability of the rubber socket, reduced cost-effectiveness, and the like.

DISCLOSURE

Technical Problem

The present disclosure is conceived in consideration of the above-described problems, an object of the present disclosure is to provide an apparatus for testing a semiconductor package, which can convert pitches of a semiconductor package and a test board, which have different pitches, using a pitch converter, thereby testing the semiconductor package.

Technical Solution

In order to achieve the above-mentioned object, an apparatus for testing a semiconductor package, which connects the semiconductor package and a test board and tests the semiconductor package, according to the present disclosure, includes a test socket comprising electrically-conductive parts mounted on the test board providing a test signal, formed at positions corresponding to pads of the test board, respectively, and made of an elastic insulating material in which a plurality of electrically-conductive particles are aligned in a thickness direction, the test socket further comprising an insulating part made of an elastic insulating material and supporting each electrically-conductive part and insulating it from the adjacent electrically-conductive part; and a pitch converter comprising a multi-layered organic device in which lower lands disposed in close contact with an upper side of the test socket and formed at positions corresponding to the electrically-conductive parts respectively, upper lands formed at positions corresponding to terminals of the semiconductor package, respectively, and wiring patterns, each of which connecting the lower land and the upper land to each other, are formed in a substrate, the pitch converter further comprising conductive contact pins deposited on the upper lands, respectively, and coming in contact with the terminals of the semiconductor package, herein a lower end of the conductive part is connected to the pad of the test board, and an upper end is connected to the lower land.

In addition, a pitch of the terminals of the semiconductor package may be smaller or greater than, or the same as a pitch between the pads of the test board.

Also, the electrically-conductive part may have an electrically-conductive upper bump protruding upward from the insulating part.

Furthermore, the apparatus for testing a semiconductor package may further include an upper film having film holes formed therein at positions corresponding to the electrically-conductive upper bumps of the electrically-conductive part, respectively, disposed in close contact with the upper side of the insulating part, and made of an insulating material.

In addition, the electrically-conductive part may have an electrically-conductive lower bump protruding downward from the insulating part.

In the test apparatus according to the present disclosure, the conductive contact pin may be manufactured through a micro electro mechanical system (MEMS) process.

Furthermore, the conductive contact pin may be formed by plating beryllium cooper (BeCu) with aurum (Au).

In addition, the conductive contact pin may include a support portion connected to the upper land and a protruding portion coming in contact with the terminal of the semiconductor device.

Also, an upper surface of the protruding portion of the conductive contact pin coming in contact with the terminal of the semiconductor device may be formed into a planar shape.

Furthermore, an upper surface of the protruding portion of the conductive contact pin coming in contact with the terminal of the semiconductor package may be formed into a shape corresponding to the terminal.

Advantageous Effect the test apparatus according to one embodiment of the present disclosure employs the pitch converter capable of converting the pitch, so there is an advantage that the existing test board can be used without any modification even if the pitch of the semiconductor package is changed.

In addition, the test apparatus according to one embodiment of the present disclosure has a configuration in which the conductive contact pin pressurizes the multi-layered organic device and the multi-layered organic device pressurizes the entire upper surface of the test socket made as a rubber socket to apply an electric current to the electrically-conductive part, so there is an advantage that damage caused by direct contact of a hard electric conductor with the electrically-conductive part is prevented, whereby durability of the test socket is increased. That is, in a conventional configuration, since the metallic electric conductor corresponding to the conductive contact pin directly pressurizes the electrically-conductive part, the electrically-conductive part may be damaged as the hard metallic electric conductor and the elastic electrically-conductive part repeatedly come in contact with each other, however, the present disclosure has a configuration in which the multi-layered organic device pressurizes the test socket, thereby reliably preventing such damage from occurring.

In addition, in the test apparatus according to one embodiment of the present disclosure, the conductive contact pin and the multi-layered organic device are formed to be separable from the test socket, so if the conductive contact pin or the multi-layered organic device is damaged, only the damaged element can be replaced, whereby there is an effect of reducing costs.

Furthermore, in the test apparatus according to one embodiment of the present disclosure, the conductive contact pin is deposited and formed on the upper land of the multi-layered organic device, and the protruding portion which is in contact with the terminal of the semiconductor package can be arranged to correspond to the fine pitch, so a short between electrically-conductive parts does not occur and the present apparatus is sufficiently capable of coping with even fine pitches resulting from the high integration of semiconductor package.

BEST MODE OF THE DISCLOSURE

Hereinafter, an apparatus for testing a semiconductor package according to the present disclosure is described in detail with reference to the accompanying drawings.

Figure 1:
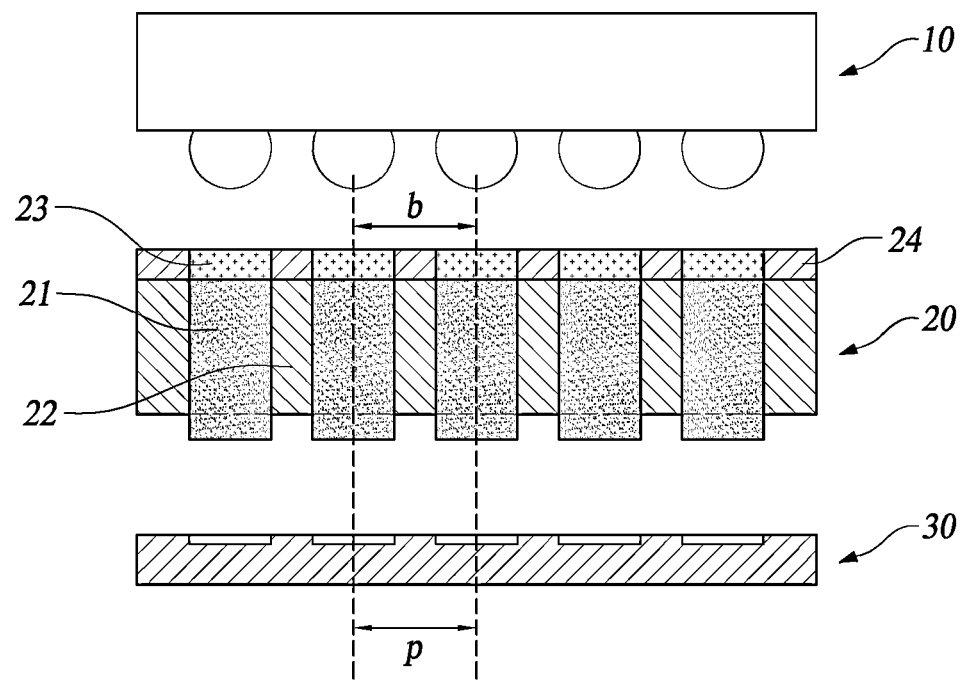
FIG. 1 shows a test apparatus having a conventional test socket.
Figure 2:
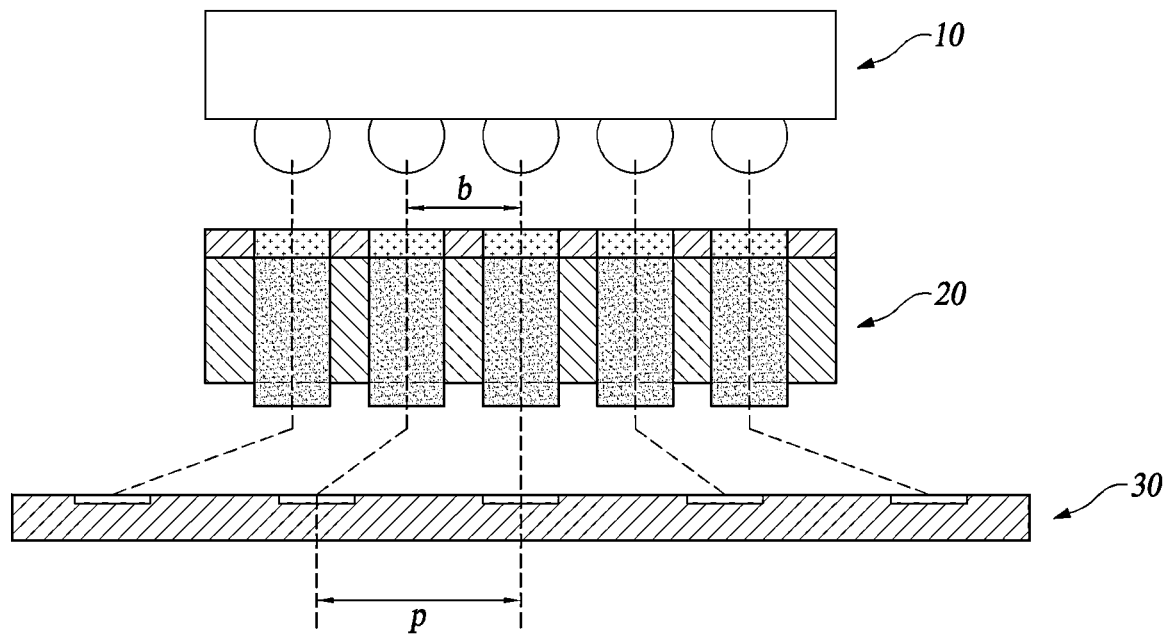
FIG. 2 is a view for describing problems occurred when a semiconductor package and a test board, which have different pitches, are tested.
Figure 3:
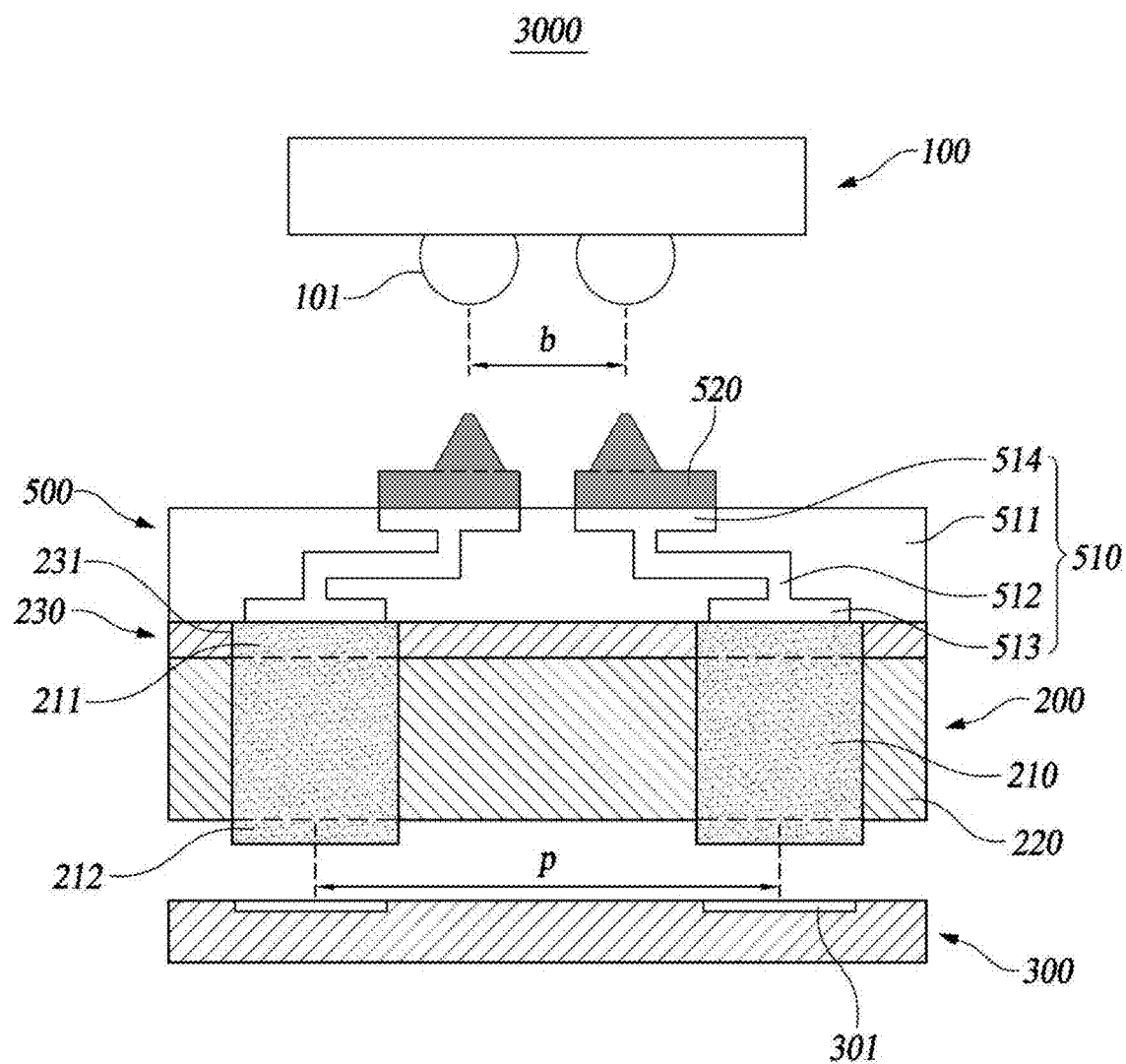
FIG. 3 shows a test apparatus with a pitch converter according to one embodiment of the present disclosure.
Figure 4:
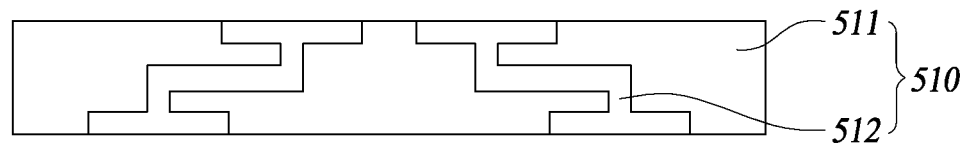
FIG. 4 shows various examples of a multi-layered organic device according to one embodiment of the present disclosure.
Figure 4:
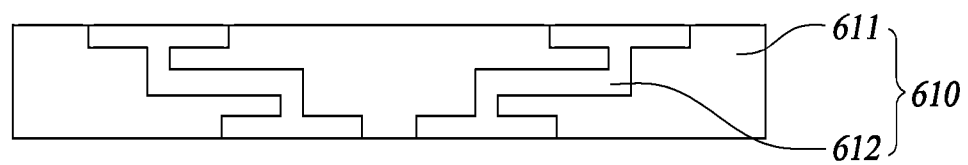
Figure 4:
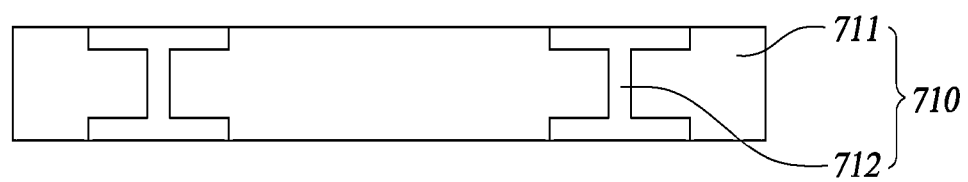
Figure 5:
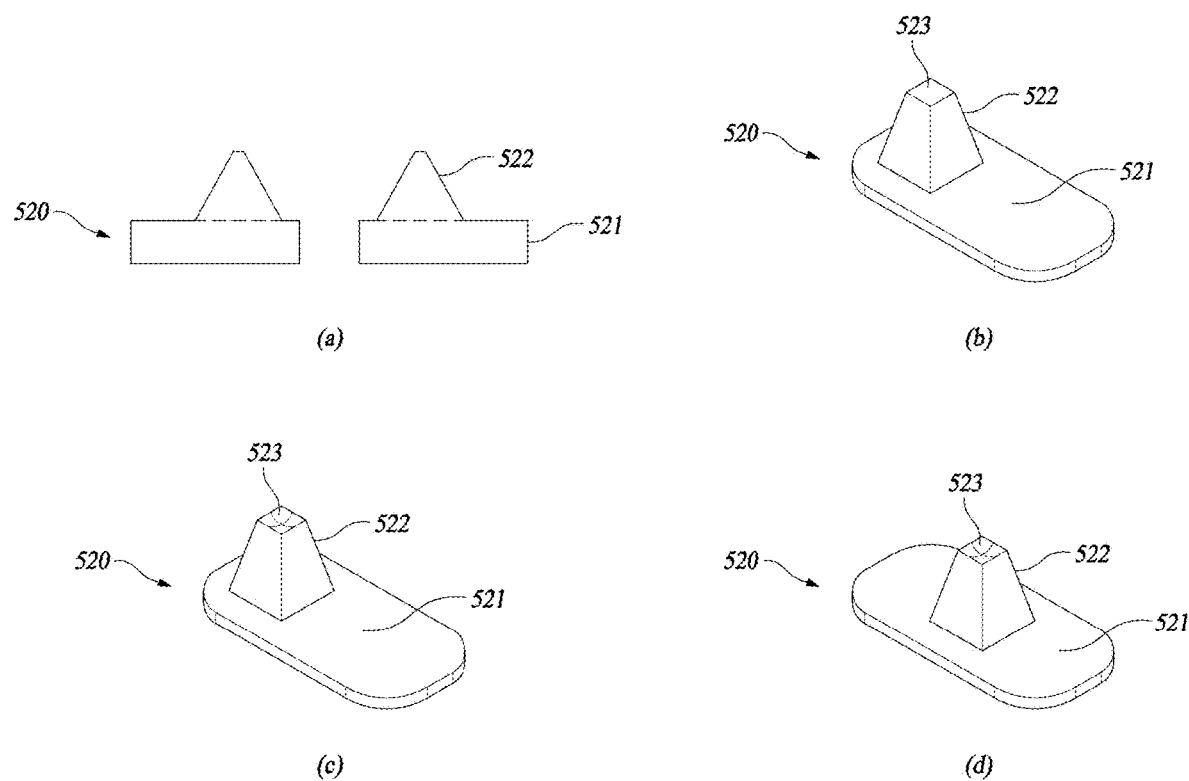
FIG. 5 shows various examples of a conductive contact pin according to one embodiment of the present disclosure.

FIG. 3 shows an apparatus for testing a semiconductor package, having a pitch converter according to one embodiment of the present disclosure, FIG. 4 shows various examples of a multi-layered organic device according to one embodiment of the present disclosure, and FIG. 5 shows various examples of a conductive contact pin according to one embodiment of the present disclosure.

As shown in the drawings, a test apparatus 3000 having a pitch converter 500 according to one embodiment of the present disclosure is an apparatus 3000 for testing a semiconductor package configured to connect a semiconductor package 100 and a test board 300 to each other to test the semiconductor package 100, and including a test socket 200 which includes electrically-conductive parts 210 mounted on the test board 300 providing a test signal, formed at positions corresponding to pads 301 of the test board, respectively, and made of an elastic insulating material in which a plurality of electrically-conductive particles are aligned in a thickness direction, and an insulating part 220 made of an elastic insulating material and supporting each electrically-conductive part and insulating it from the adjacent electrically-conductive part 210. In addition, the test apparatus further includes the pitch converter 500 provided with a multi-layered organic device 510, in which lower lands 513 disposed in close contact with an upper side of the test socket 200 and formed at positions corresponding to the electrically-conductive parts 210 respectively, upper lands 514 formed at positions corresponding to the terminals 101 of the semiconductor package, respectively, and wiring patterns 512, each of which connecting the lower land 513 and the upper land 514 to each other, are formed in a substrate 511, and conductive contact pins 520 deposited on the upper lands 514, respectively, and coming in contact with terminals 101 of the semiconductor package, wherein a lower end of the electrically-conductive part 210 comes in contact with the pad 301 of the test board and an upper end comes in contact with the lower land 513.

Hereinafter, it is described as an example that the pitch converter 500 according to one embodiment of the present disclosure is disposed on an upper side of the test socket 200 and performs the function of transmitting an electrical signal between the test board 300 and the semiconductor package 100 having different pitches. FIG. 3 shows the test board 300 with a wide pitch p, and the test apparatus 3000 provided with the pitch converter 500 used for a semiconductor package 100 with a narrow pitch b and provided on the upper side of the test socket 200.

In the present disclosure, an upper surface, an upper side, or a top of each component disposed between the test board 300 and the semiconductor package 100 is defined as indicating the side of the component, proximal to the semiconductor package 100, and a lower surface, a lower side, or a bottom of each component is defined as indicating the side distal to the test board 300.

The test socket 200 is mounted on the test board 300 placed on a tester (not shown) that provides a test signal. The test socket 200 is made as a rubber socket, and includes the electrically-conductive parts 210 formed at positions corresponding to the pads 301 of the test board, respectively, and formed of an elastic insulating material in which a plurality of electrically-conductive particles are aligned in a thickness direction (i.e., a direction connecting the upper end the lower of the electrically-conductive part 210), and the insulating part 220 made of an elastic insulating material and supporting each electrically-conductive part, while insulating the electrically-conductive part 210 from the adjacent one. The test socket 200 of the present disclosure which is formed as the rubber socket as above has an anisotropic electrically-conductive characteristic by which, when the electrically-conductive part 210 is pressurized, the electrically-conductive particles in the electrically-conductive part 210 come into contact with each other to form a conductive path through which electricity flows in a thickness direction of the test socket 200.

In the present disclosure, even if the pitch of the semiconductor package 100 is changed, the pitch converter 500, which will be described later, is used, so the test socket 200 mounted on the existing test board 300 is used without any modification.

A cross-linked heat-resistant polymer material, for example silicone rubber, etc., may be employed as an elastic insulating material constituting the electrically-conductive part 210, and as the electrically-conductive particles constituting the electrically-conductive part 210, particles made of a magnetic material so as to react by a magnetic field, for example, particles of magnetic metal such as iron, nickel, cobalt, etc., or alloy particles of the above metal, or particles containing the above metal, or particles containing the above particles as core particles and having metals with good conductivity, such as gold, silver, palladium, radium or the like plated on surfaces of the core particles, may be employed.

As an elastic insulating material constituting the insulating part 220, an elastic insulating material which is the same as that used in the electrically-conductive part 210 may be employed.

The electrically-conductive part 210 may have an electrically-conductive upper bump 211 that protrudes upward from the insulating part 220. The electrically-conductive upper bump 211 makes a contact between the electrically-conductive part and the lower land 513 of the multi-layered organic device (MLO) 510 easier.

Additionally, the electrically-conductive part 210 may have an electrically-conductive lower bump 211 that protrudes downward from the insulating part 220. The electrically-conductive lower bump 212 makes a contact between the electrically-conductive part and the pad 301 of the test board easier.

In other words, the lower land 513 and the pad 301 of the test board have a generally flat shape and upper and lower surfaces of the electrically-conductive part 210 also have a generally flat shape, such that when the electrically-conductive part 210 is formed to have the same height as that of the insulating part 220, the contact between the upper surface of the electrically-conductive part 210 and the lower land 513 and the contact between the lower surface of the electrically-conductive part 210 and the pad 301 of the test board may not be sufficient. However, if the electrically-conductive upper bump 211 or the electrically-conductive lower bump 212 is formed on electrically-conductive part 210, the lower land 513 or the pad 301 of the test board may compress the protruded the electrically-conductive upper bump 211 or the electrically-conductive lower bump 212 of the electrically-conductive part to allow sufficient contact to be made.

The electrically-conductive part 210 may have a configuration in which neither the electrically-conductive upper bump 211 nor and the electrically-conductive lower bump 212 are formed, may have a configuration in which only one of the electrically-conductive upper bump 211 and the electrically-conductive lower bump 212 is formed, and may be formed to have a configuration in which both the electrically-conductive upper bump 211 and the electrically-conductive lower bump 212 are formed thereon.

When the electrically-conductive upper bump 211 is formed on the electrically-conductive part 210, an upper film 230 supporting the electrically-conductive upper bump 211 may be disposed in a configuration in which it is attached to an upper side of the insulating part 220. The upper film 230 has film holes 231 formed at positions corresponding to the electrically-conductive upper bumps 211 of the electrically-conductive part, respectively and is disposed in close contact with the upper side of the insulating part 220, so the electrically-conductive upper bumps 211 of the electrically-conductive part is arranged in the film hole 231, The electrically-conductive upper bump 211 of the electrically-conductive part may be formed to have the same height as the film hole 231 or may be formed to protrude slightly upward from the film hole 231. It is preferable that the electrically-conductive upper bump 211 of the electrically-conductive part protrudes slightly upwards from the film hole 231, because this configuration makes a contact between the electrically-conductive upper bump and the lower land 513 easier.

The upper film 230 may be adhered in the process for manufacturing the electrically-conductive part 210 and the insulating part 220 of the test socket 200, or may also be adhered to the upper side of the insulating part 220 using an adhesive made of the same material as the elastic insulating material constituting the insulating part 220.

The upper film 230 is formed from insulating material and the upper film should support the electrically-conductive upper bump 211 of the electrically-conductive part, so it is preferable for the upper film to make a material which is harder than that constituting the electrically-conductive upper bump 211 of the electrically-conductive part. Therefore, polyimide substance may be employed as a material constituting the upper film 230. In addition, the upper film 230 is disposed in a region other than a region where the electrically-conductive part 210 of the test socket 200 and the lower land 513 of the multi-layered organic device 510 are connected to each other to prevent a short-circuit between the test socket 200 and the multi-layered organic device 510 from occurring.

The apparatus 3000 for testing a semiconductor package, according to one embodiment of the present disclosure includes the pitch converter 500 provided with the multi-layered organic device 510, in which the lower lands 513 disposed in close contact with the upper side of the test socket 200 and formed at positions corresponding to the electrically-conductive parts 210 respectively, the upper lands 514 formed at positions corresponding to the terminals 101 of the semiconductor package, respectively, and the wiring patterns 512, each of which connecting the lower land 513 and the upper land 514 to each other, are formed in the substrate 511, and the conductive contact pins 520 deposited on the upper land 514, respectively and coming in contact with the terminals 101 of the semiconductor package when a test is being performed.

The multi-layered organic device (MLO) 510 is a type of multi-layered printed circuit board using polymer organic high-density interconnection technology that utilizes a very thin, low-loss dielectric to achieve excellent RF performance at a high frequency.

The multi-layered organic device 510 has a configuration in which a circuit is formed in the substrate 511, and is placed in close contact with the upper side of the test socket 200.

The lower land 513 is formed at a position corresponding to each electrically-conductive part 210 of the test socket 200 positioned therebelow, the upper land 514 is formed at a position corresponding to each terminal 101 of the semiconductor package positioned thereabove, and the lower land 513 and the upper land 514 are connected by the wiring pattern 512, so the lower land 513 and the upper land 514 are electrically connected to each other. Therefore, the multi-layered organic device 510 has a circuit which can change the pitch between the upper land 514 and the lower land 513 through the wiring pattern 512.

Since the multi-layered organic device 510 is placed in close contact with the upper side of the test socket 200, an entire lower surface of the multi-layered organic device 510 is in contact with an entire upper surface of the test socket 200, so when the multi-layered organic device 510 is pressurized, a wide surface of the multi-layered organic device 510 can pressurize the entire upper surface of the test socket 200.

As shown in (a) of FIG. 4, the multi-layered organic device 510 may have the lower lands 513 having a gap therebetween which is greater than that between the upper lands 514. The wiring patterns 512 are formed in a stepped configuration in which a distance therebetween becomes narrower from the lower land 513 to the upper land 514. This multi-layered organic device 510 may be employed when the pitch of the terminals of the semiconductor package 100 is smaller than the pitch of the pads of the test board 300.

On the contrary, As shown in (b) of FIG. 4, a multi-layered organic device 610 may have the lower lands 513 having a gap therebetween which is smaller than that between the upper lands 514. Wiring patterns 612 are formed in a stepped configuration in which a distance therebetween becomes wider from the lower land 513 to the upper land 514. This multi-layered organic device 610 may be employed when the pitch of the semiconductor package 100 is greater than the pitch of the test board 300.

In addition, as shown in (c) of FIG. 4, a multi-layered organic device 710 may be configured such that a gap between the upper lands 514 is the same as that between the lower lands 513. This configuration may be employed when the pitch of the semiconductor package 100 is smaller than the pitch of the test board 300. It should be noted that, in the above various types of multi-layered organic devices 510, 610, and 710, the lower land 513 and upper land 514 are described using the same reference numerals.

As shown in FIGS. 3 and 5, the conductive contact pin 520 may be deposited and formed on an upper surface of the upper land 514 of the multi-layered organic device 510. The conductive contact pin 520 is connected to the multi-layered organic device 510 to bring the multi-layered organic device into contact with the terminal 101 of the semiconductor package.

The conductive contact pin 520 includes a support portion 521 connected to the upper land and a protruding portion 522 coming in contact the terminal 101 of the semiconductor package when the test is being performed. An upper surface 523 of the protruding portion is a part which becomes in direct contact with the terminal 101 of the semiconductor package, and may have a planar shape as shown in (b) of FIG. 5, or may have a shape corresponding to the terminal 101 of the semiconductor package as shown in (c) and (d) of FIG. 5. If the terminal 101 of the semiconductor package is a solder ball, the above upper surface may be formed to have a concave recess shape. Forming the upper surface 523 of the protruding portion 522 in a shape corresponding to the terminal 101 of the semiconductor package improves the contact performance between the terminal 101 of the semiconductor package and the conductive contact pin 520, thereby reducing electrical resistance.

Figure 6:
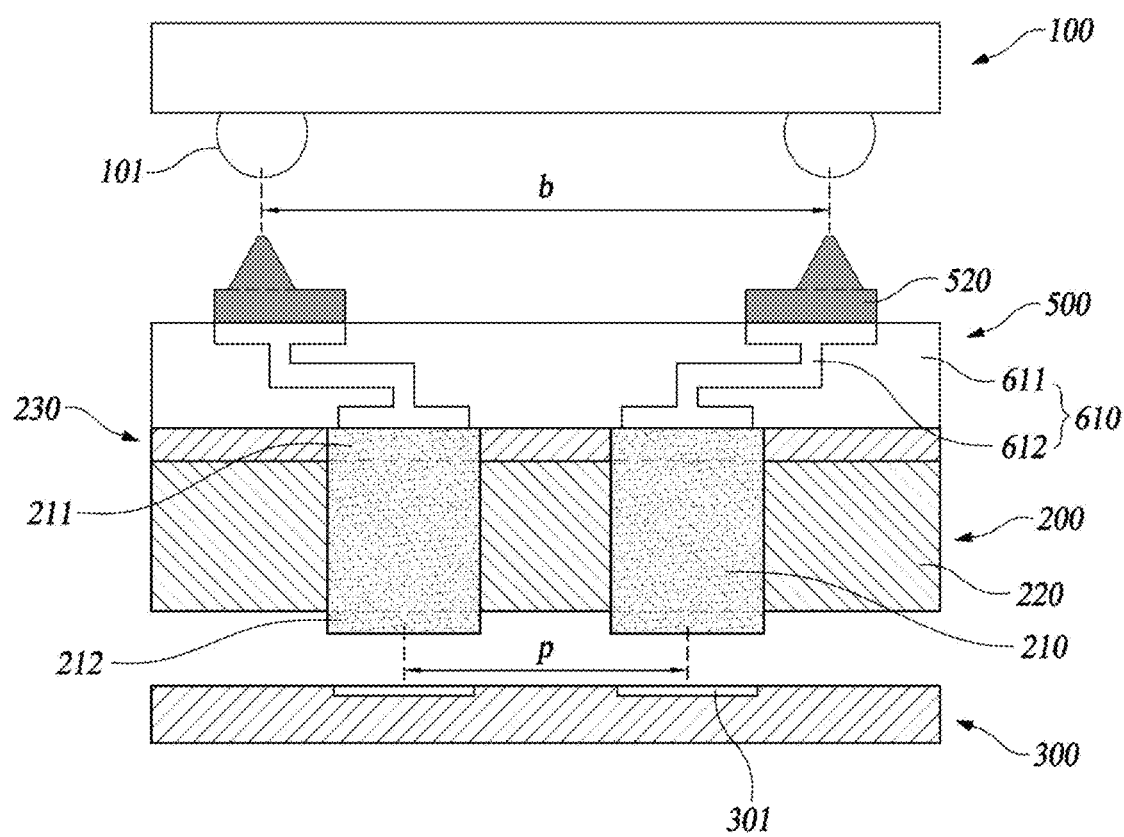
FIG. 6 shows a test apparatus with a pitch converter according to another embodiment of the present disclosure.
Figure 7:
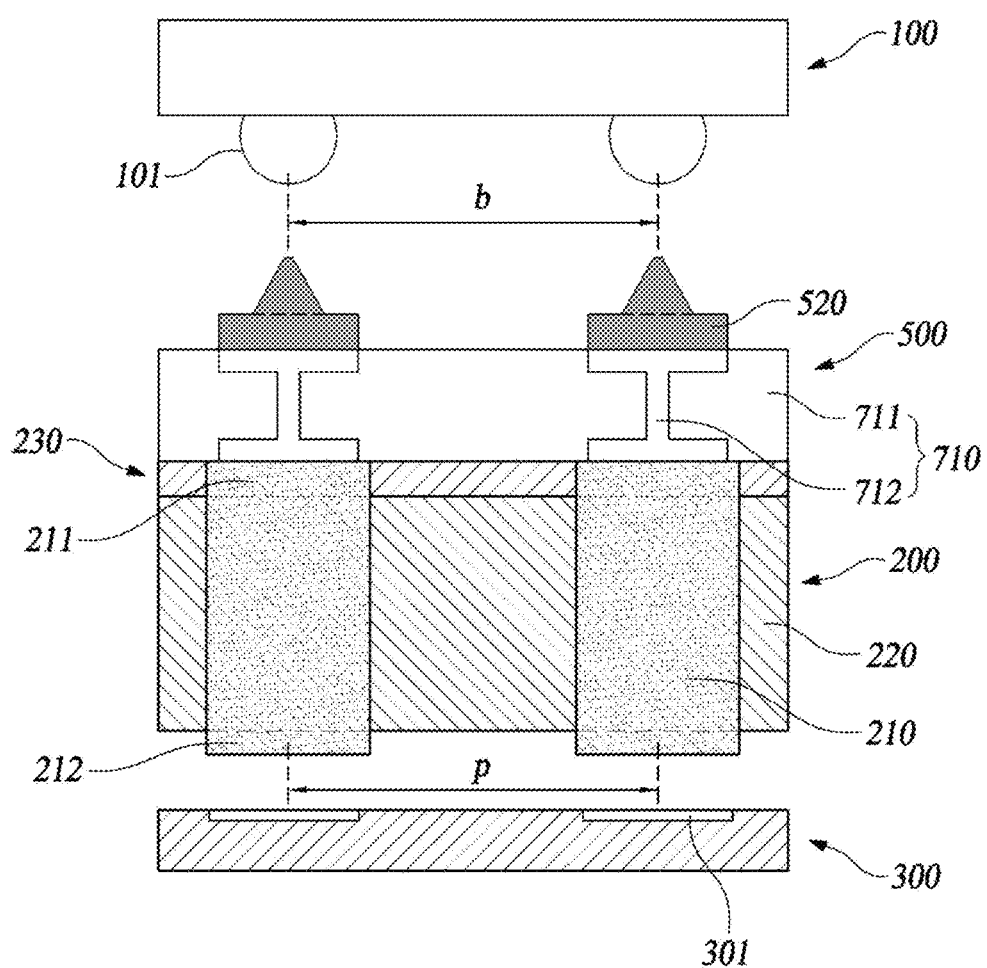
FIG. 7 shows a test apparatus with a pitch converter according to yet another embodiment of the present disclosure.

The protruding portion 522 may be formed at a central region of the support portion 521 ((d) of FIG. 5d), but may also be formed to be biased towards one side of the support portion 521. As shown in FIG. 3, when the pitch of the semiconductor package 100 is smaller than the pitch of the test board 300 (b<p), in the adjacent conductive contact pins 520, if the protruding portions 522 are disposed biased to one side so as to be close to each other, theses conductive contact pins may be applied to the semiconductor package having a narrower pitch, as shown in FIG. 6, when the pitch of the semiconductor package 100 is greater than the pitch of the test board 300 (b>p), in the adjacent conductive contact pins 520, if the protruding portions 522 are disposed biased to one side in so as to be away from each other, theses conductive contact pins may be applied to the semiconductor package having a wider pitch, and as shown in FIG. 7, when the pitch of the semiconductor package 100 is the same as the pitch of the test board 300 (b=p), if the protruding portions 522 are formed at the central regions of the support portions 521d, respectively, the conductive contact pin may be coupled with the terminal 101 of the semiconductor package in position.

The conductive contact pin 520 may be manufactured through a MEMS process. The MEMS (micro electro mechanical system) process mainly utilizes a photomask process and an imprint process of a semiconductor integrated circuit manufacturing technology, and since the conductive contact pin 520 is manufactured through the MEMS process, it possible to manufacture the conductive contact pin having a uniform size and shape, thereby obtaining an electrical stability.

The support portion 521 and the protruding portion 522 of the conductive contact pin 520 may be formed as one piece through the MEMS process, or the support portion 521 and the protruding 522 may be manufactured separately, and deposited to be formed into one piece.

The conductive contact pin 520 may be formed by plating beryllium cooper (BeCu) with aurum (Au). The conductive contact pin 520 made of such materials has excellent conductivity, and hence preventing signal loss.

Since the conductive contact pin 520 formed in this way is deposited on the upper land 514 of the multi-layer organic device 510, there is an advantage that the conductive contact pin can be easily disposed in a correct position corresponding to the terminal 101 of the semiconductor package, thereby performing an easy alignment.

The apparatus for testing a semiconductor package, provided equipped with the pitch converter 500 according to one embodiment of the present disclosure is operated as follows.

When a pusher (not shown) pressurizes the semiconductor package 100 to test the semiconductor package 100 having a different pitch, the semiconductor package 100 pressurizes the multi-layered organic device 510 through the conductive contact pin 520, and the multi-layered organic device 510 pressurizes the test socket 200 to allow the test socket 200 to be pressed against the test board 300. At this time, the terminal 101 of the semiconductor package 100 is connected to the conductive contact pin 520, the conductive contact pin 520 is connected to the upper surface of the electrically-conductive part 210 through the upper land 514, the wiring pattern 512 and the lower land 513 of the multi-layered organic device 510, the lower surface of the electrically-conductive part 210 is connected to the pad 301 of the test board to electrically connect the pad 301 of the test board 300 and the terminal of the semiconductor package 100, and a test signal from the test board 300 is thus transmitted to the semiconductor package 100 to test whether the semiconductor package 100 is defective.

As described above, the test apparatus according to one embodiment of the present disclosure employs the pitch converter capable of converting the pitch, so the existing test board can be used without any modification even if the pitch of the semiconductor package is changed.

In addition, the test apparatus according to one embodiment of the present disclosure has a configuration in which the conductive contact pin pressurizes the multi-layered organic device and the multi-layered organic device pressurizes the entire upper surface of the test socket made as a rubber socket to apply an electric current to the electrically-conductive part, so there is an advantage that damage caused by direct contact of a hard electric conductor with the electrically-conductive part is prevented, whereby durability of the test socket is increased. That is, in a conventional configuration, since the metallic electric conductor corresponding to the conductive contact pin directly pressurizes the electrically-conductive part, the electrically-conductive part may be damaged as the hard metallic electric conductor and the elastic electrically-conductive part repeatedly come in contact with each other, however, the present disclosure has a configuration in which the multi-layered organic device pressurizes the test socket, thereby reliably preventing such damage from occurring.

In addition, in the test apparatus according to one embodiment of the present disclosure, the conductive contact pin and the multi-layered organic device are formed to be separable from the test socket, so if the conductive contact pin or the multi-layered organic device is damaged, only the damaged element can be replaced, whereby there is an effect of reducing expenses.

Furthermore, in the test apparatus according to one embodiment of the present disclosure, the conductive contact pin is deposited and formed on the upper land of the multi-layered organic device, and the protruding portion which is in contact with the terminal of the semiconductor package can be arranged to correspond to the fine pitch, so a short-circuit between electrically-conductive parts does not occur and the present apparatus is sufficiently capable of coping with even fine pitches resulting from the high integration of semiconductor package.

As shown in FIG. 6, the test apparatus 4000 according to another embodiment of the present disclosure can also be applied to a test apparatus for testing the semiconductor package 100 having a pitch b wider than the pitch p of the test board 300.

Compared to FIG. 3, the test apparatus 4000 shown in FIG. 6 is characterized only in that, in response to the semiconductor package 100 having a wide pitch, the wiring patterns 612 of the multi-layered organic device 610 are formed in a stepped configuration in which a distance therebetween becomes wider from the lower land 513 to the upper land 514, and the protruding portion 522 of the conductive contact pin 520 is disposed biased to one side in so as to be away from the adjacent conductive contact pin 520.

As shown in FIG. 7, the test apparatus 5000 according to another embodiment of the present disclosure may be applied to a test apparatus for testing the semiconductor package in a case where the pitch p of the test board 300 is the same as the pitch b of the semiconductor package 100.

Compared to FIG. 3, the test apparatus 5000 shown in FIG. 7 is characterized only in that the multi-layered organic device 710 is formed such that a distance between the lower lands 513 is the same as a distance between the upper lands 514 and the protruding portion 522 of the conductive contact pin 520 is formed at the central region of the support portion 521.

Although the present disclosure has been described above by way of preferred examples, the scope of the present disclosure is not limited to the form previously described and illustrated.

For example, although, in the present disclosure, a configuration, in which the film holes are formed at positions corresponding to the electrically-conductive upper bumps of the electrically-conductive part, respectively and the upper film made of an insulating material is adhered to the upper side of the insulating part, is described by way of example, the film holes may be formed at positions corresponding to the electrically-conductive lower bumps of the electrically-conductive part, respectively and an upper film made of an insulating material and adhered to a lower side of the insulating part may be disposed.

In the above, the present disclosure has been illustrated and described in connection with a preferred embodiment for illustrating the principle of the present disclosure, but the present disclosure is not limited to the configuration and operation as shown and described as such. Rather, it will be well understood by those skilled in the art that many changes and modifications can be made to the present disclosure without departing from the spirit and scope of the appended claims.

The invention claimed is:

1. An apparatus for testing a semiconductor package, which connects the semiconductor package and a test board and tests the semiconductor package, comprising:
   a test socket comprising electrically-conductive parts mounted on the test board providing a test signal, formed at positions corresponding to pads of the test board, respectively, and made of an elastic insulating material in which a plurality of electrically-conductive particles are aligned in a thickness direction, the test socket further comprising an insulating part made of an elastic insulating material and supporting each electrically-conductive part and insulating it from the adjacent electrically-conductive part; and
   a pitch converter comprising a multi-layered organic device in which lower lands disposed in close contact with an upper side of the test socket and formed at positions corresponding to the electrically-conductive parts respectively, upper lands formed at positions corresponding to terminals of the semiconductor package, respectively, and wiring patterns, each of which connecting the lower land and the upper land to each other, are formed in a substrate, the pitch converter further comprising conductive contact pins deposited on the upper lands, respectively, and coming in contact with the terminals of the semiconductor package,
   wherein a lower end of the conductive part is connected to the pad of the test board, and an upper end is connected to the lower land.

2. The apparatus for testing a semiconductor package of claim 1, wherein a pitch of the terminals of the semiconductor package is smaller or greater than, or the same as a pitch between the pads of the test board.

3. The apparatus for testing a semiconductor package of claim 1, wherein the electrically-conductive part has an electrically-conductive upper bump protruding upward from the insulating part.

4. The apparatus for testing a semiconductor package of claim 3, further comprising an upper film having film holes formed therein at positions corresponding to the electrically-conductive upper bumps of the electrically-conductive part, respectively, disposed in close contact with the upper side of the insulating part, and made of an insulating material.

5. The apparatus for testing a semiconductor package of claim 1, wherein the electrically-conductive part has an electrically-conductive lower bump protruding downward from the insulating part.

6. The apparatus for testing a semiconductor package of claim 1, wherein the conductive contact pin is manufactured through a micro electro mechanical system (MEMS) process.

7. The apparatus for testing a semiconductor package of claim 1, wherein the conductive contact pin is formed by plating beryllium cooper (BeCu) with aurum (Au).

8. The apparatus for testing a semiconductor package of claim 1, wherein the conductive contact pin comprises a support portion connected to the upper land and a protruding portion coming in contact with the terminal of the semiconductor device.

9. The apparatus for testing a semiconductor package of claim 8, wherein an upper surface of the protruding portion of the conductive contact pin coming in contact with the terminal of the semiconductor package is formed into a planar shape.

10. The apparatus for testing a semiconductor package of claim 8, wherein an upper surface of the protruding portion of the conductive contact pin coming in contact with the terminal of the semiconductor device is formed into a shape corresponding to the terminal.

* * * * *